United States Patent
Lee

(10) Patent No.: US 7,274,599 B2
(45) Date of Patent: Sep. 25, 2007

(54) NOR FLASH MEMORY DEVICE USING BIT SCAN METHOD AND RELATED PROGRAMMING METHOD

(75) Inventor: Doo-Sub Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 79 days.

(21) Appl. No.: 11/320,470

(22) Filed: Dec. 29, 2005

(65) Prior Publication Data
US 2006/0239078 A1    Oct. 26, 2006

(30) Foreign Application Priority Data
Apr. 13, 2005    (KR) .................... 10-2005-0030807

(51) Int. Cl.
*G11C 16/06* (2006.01)
(52) U.S. Cl. .................... 365/185.22; 365/185.17; 365/185.23; 365/185.24; 365/185.03
(58) Field of Classification Search ........... 365/185.22, 365/185.17, 185.23, 185.24, 185.03
See application file for complete search history.

(56) References Cited

U.S. PATENT DOCUMENTS

| | | | |
|---|---|---|---|
| 6,172,917 B1 * | 1/2001 | Kataoka et al. | 365/189.05 |
| 6,314,025 B1 | 11/2001 | Wong | |
| 6,597,605 B2 * | 7/2003 | Kreifels et al. | 365/185.28 |

FOREIGN PATENT DOCUMENTS

| | | |
|---|---|---|
| JP | 11-353886 | 12/1999 |
| KR | 1999-0076163 | 10/1999 |
| KR | 1020000027297 | 5/2000 |
| KR | 1020020028331 | 4/2002 |

* cited by examiner

*Primary Examiner*—Connie C. Yoha
(74) *Attorney, Agent, or Firm*—Volentine & Whitt, PLLC

(57) ABSTRACT

A NOR flash memory device configured to perform a program operation using an ISPP scheme, and comprising a plurality of memory cells, a word line voltage generator, and a scan controller is provided. A method of programming the NOR flash memory device comprising a bit scan method is also provided. The maximum number of cells that may be programmed simultaneously in the bit scan method is indicated by a scan bit number. The scan bit number may be changed by the scan controller during the program operation.

19 Claims, 6 Drawing Sheets

Fig. 5

| ISPP | WL Voltage | Scan Bit | | | | | | | |
|---|---|---|---|---|---|---|---|---|---|
| 1st Program | 4.20V | 4Bit | 1μs | 1μs | 1μs | 1μs | 1μs | 1μs | 1μs |
| 2nd Program | 4.35V | 8Bit | 0.5μs | 0.5μs | 0.5μs | 0.5μs | 0.5μs | 0.5μs | 0.5μs |
| 3rd Program | 4.50V | 8Bit | 0.5μs | 0.5μs | 0.5μs | 0.5μs | 0.5μs | 0.5μs | 0.5μs |
| 4th Program | 4.65V | 8Bit | 0.5μs | 0.5μs | 0.5μs | 0.5μs | 0.5μs | 0.5μs | 0.5μs |
| 5th Program | 4.80V | 8Bit | 0.5μs | 0.5μs | 0.5μs | 0.5μs | 0.5μs | 0.5μs | 0.5μs |
| 6th Program | 4.95V | 8Bit | 0.5μs | 0.5μs | 0.5μs | 0.5μs | 0.5μs | 0.5μs | 0.5μs |
| 7th Program | 5.10V | 8Bit | 0.5μs | 0.5μs | 0.5μs | 0.5μs | 0.5μs | 0.5μs | 0.5μs |

NOR FLASH MEMORY DEVICE USING BIT SCAN METHOD AND RELATED PROGRAMMING METHOD

BACKGROUND OF THE INVENTION

1. Field of the Invention

Embodiments of the present invention relate to semiconductor memory devices. More particularly, embodiments of the invention relate to NOR flash memory devices adapted for use with a bit scan method and related programming method(s).

This application claims priority to Korean Patent Application No. 2005-30807, filed on Apr. 13, 2005, the subject matter of which is hereby incorporated by reference in its entirety.

2. Description of Related Art

Semiconductor memory devices are capable of writing (i.e., storing) data into memory, and thereafter reading the stored data from memory, as needed. Generally, semiconductor memory devices may be classified as random access memories (RAMs) and read only memories (ROMs). RAMs are volatile semiconductor memory devices, so a RAM will lose its stored data when power is not supplied to the device. ROMs, however, are non-volatile semiconductor memory devices, so a ROM will maintain its stored data even when power is not supplied to the device. RAMs include dynamic RAM (DRAM) and static RAM (SRAM), and ROMs include programmable ROM (PROM), erasable PROM (EPROM), electrically EPROM (EEPROM), and flash memory.

Flash memory devices provide rapid input and output of data with low power consumption, and as such, are particularly well suited for use in mobile equipment such as digital cameras, cellular phones, and personal digital assistants (PDAs). Flash memory may be categorized as NAND flash memory and NOR flash memory. NAND flash memory devices are typically used to store data in USB storage devices and MP3 players. On the other hand, NOR flash memory devices are typically used to store programming code in mobile telecommunication terminals and similar devices implementing high-speed data processing.

In recent years, NOR flash memory devices have been developed which store multiple bits of data in each memory cell. A memory cell storing multiple data bits is commonly referred to as a multi-level cell (MLC). An MLC storing 2-bit data, for example, may store any one of four data values "11," "10," "01," and "00," in accordance with a threshold voltage distribution.

Conventional NOR flash memory devices perform a program operation using an incremental step pulse programming (ISPP) scheme. A NOR flash memory device performing a program operation using an ISPP scheme uses a bit scan method in order to enhance programming speed. The bit scan method comprises repeatedly detecting bit groups within the input data and, for each bit group, programming all of the cells that correspond to a bit in the bit group simultaneously. Each bit in a bit group has a data value of "0." The bit scan method makes it possible to enhance programming speed and shorten the programming time of a NOR flash memory device.

However, the programming time for a conventional NOR flash memory device as programmed using an ISPP scheme with a bit scan method is less than optimal. The programming time for conventional NOR flash memory devices programmed in this manner is less than optimal because the maximum number of bits in a bit group when a first step voltage is applied to a word line is equal to the maximum number of bits in a bit group when each one of a number of subsequent step voltages is applied.

One example of the less than optimal programming time performance associated with conventional NOR flash memory devices programmed according to the foregoing method will now be described. A programming operation for programming a previously erased MLC to the threshold voltage corresponding to a data value "01" using an ISPP scheme will now be described.

The programming operation begins with the application of a first step voltage (e.g., 4.2V) to a word line. During each programming interval (e.g., a time period of 1 microsecond), a bit group comprising a number of bits having a data value of "0," wherein the number of bits is, at most, equal to a scan bit number, is detected. All of the MLCs corresponding to bit(s) in the bit group are programmed simultaneously. A verify operation is then performed to verify whether each one of the programmed MLCs has reached a desired threshold voltage. If an MLC has not reached the desired threshold voltage, a second step voltage (e.g., 4.35V) is applied to the word line. The second step voltage is applied during another programming interval (e.g., another time period of 0.5 microsecond). Here again, a bit group comprising a number of bits having a data value of "0," wherein the number of bits is, at most, equal to the scan bit number, is detected, and all of the memory cells that correspond to a bit of the bit group are programmed simultaneously. This sequence of steps is repeated in the program operation, wherein each successive step voltage is greater than the preceding step voltage, until each MLC reaches the desired threshold voltage level.

As can be seen from the foregoing example, the duration of the programming operation for the conventional NOR flash memory device is determined by the scan bit number. This number does not change, but remains fixed throughout the program operation.

SUMMARY OF THE INVENTION

In one embodiment, the invention provides a NOR flash memory device comprising a plurality of memory cells, a word line voltage generator configured to apply successive step voltages to a word line connected to the plurality of memory cells, and a scan controller configured to detect a bit group in relation to a scan bit number, and further configured to change the scan bit number in relation to one or more of the step voltages, wherein bits in the bit group correspond to memory cells to be simultaneously programmed, and wherein the bit group comprises, at most, the number of bits indicated by the scan bit number.

In another embodiment, the invention provides a method of programming a NOR flash memory device comprising a plurality of memory cells and configured to supply successive step voltages to a word line connected to the plurality of memory cells. The method comprises defining a first programming step in relation to a first step voltage, a first programming step time period, and a first scan bit number, and defining a second programming step in relation to a second programming step voltage, a second programming step time period, and a second scan bit number greater than the first scan bit number. The method further comprises, during the first programming step time period, applying the first step voltage to the word line, detecting a bit group in relation to the first scan bit number and programming memory cells associated with the detected bit group in accordance with the applied first step voltage, performing a verification operation to determine whether the programmed memory cells have a desired threshold voltage, and if not, during the second programming step time period, applying the second step voltage to the word line, detecting a bit group in relation to the second scan bit number and programming memory cells associated with the detected bit group in accordance with the applied second step voltage.

BRIEF DESCRIPTION OF THE DRAWINGS

FIG. 5 is a concept diagram illustrating the time required to perform a program operation, using the ISPP scheme, in the NOR flash memory device of FIG. 1.

DESCRIPTION OF EXEMPLARY EMBODIMENTS

Figure 1:
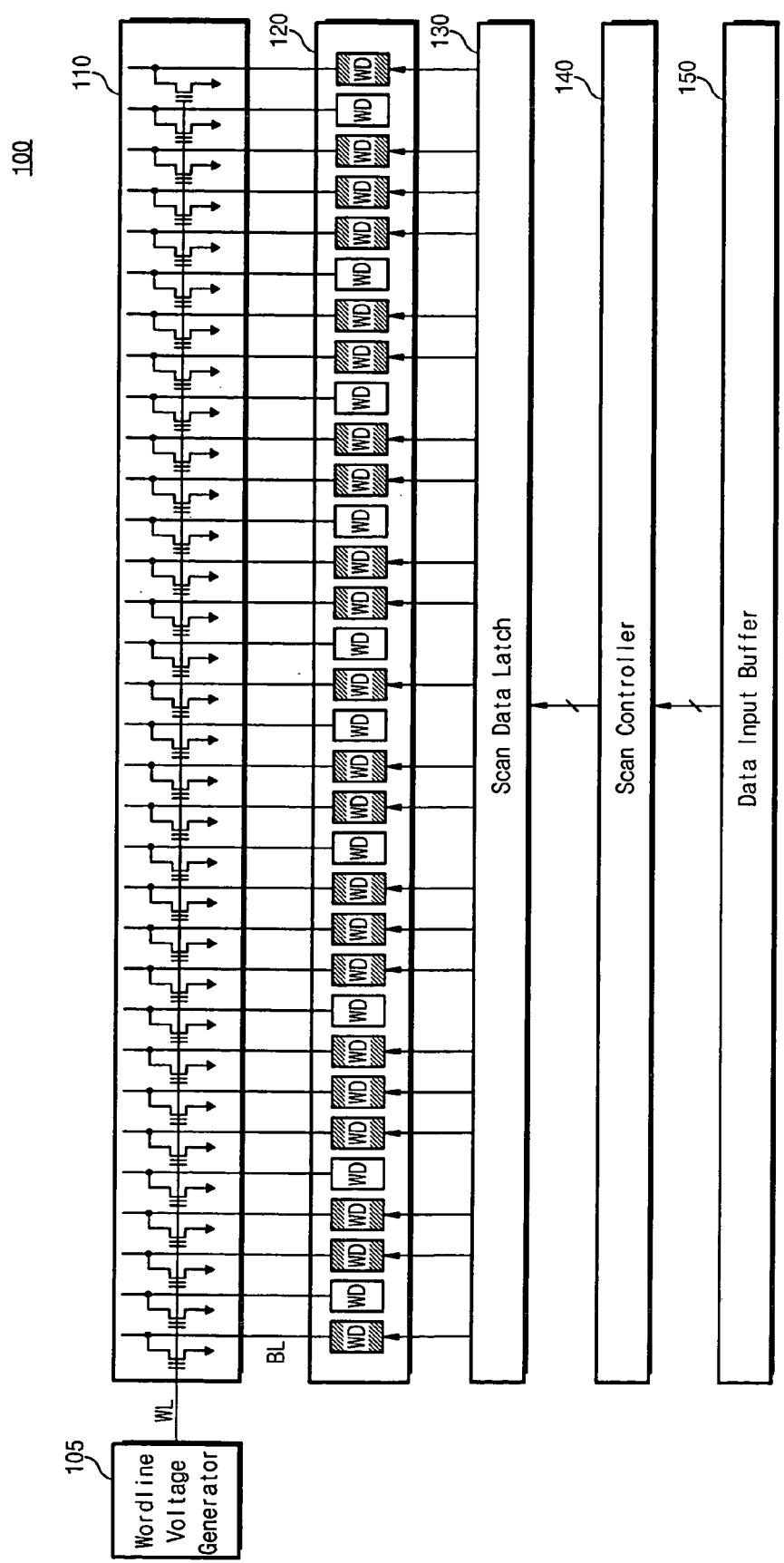
FIG. 1 is a block diagram of a NOR flash memory device in accordance with the present invention.

A NOR flash memory device 100 designed in accordance with one embodiment of the present invention is illustrated in FIG. 1. NOR flash memory device 100 comprises a cell array 110 comprising a plurality of memory cells.

These constituent memory cells may be single-level cells (SLCs) that store one-bit data, or multi-level cells (MLCs) that store multi-bit data. In the exemplary embodiment(s) that follow, each memory cell in the plurality of memory cells will be assumed to be an MLC adapted to store 2-bit data using a threshold voltage that varies in accordance with a threshold voltage distribution corresponding to 2-bit data value(s). Hereinafter, the terms "cell" or "memory cell" refer to an MLC. In accordance with the threshold voltage distribution, the exemplary cell assumed for the following description stores one of four threshold voltages, each of which corresponds to one of the 2-bit data values "11," "10," "01," and "00."

Hereinafter, a cell that stores the threshold voltage that corresponds to the 2-bit data value "11" will be referred to as an "erased cell". NOR flash memory device 100 programs an erased cell by applying step voltages to a word line in an incremental step pulse programming (ISPP) scheme. A voltage applied during the course of an ISPP operation will be referred to as a "step voltage." For convenience of description, the threshold voltages that correspond to the 2-bit data values "11," "10," "01," and "00" will be referred to as "the 11 voltage", "the 10 voltage", "the 01 voltage", and "the 00 voltage", respectively. In addition, cells are programmed using a program operation that comprises multiple programming steps (e.g., iterative or successive) applying different programming voltages.

Hereinafter, the phrase "successive step voltages" refers to a sequence of one or more step voltages wherein each successive step voltage following a first step voltage is greater than the preceding step voltage. It is further assumed in the description that follows that successive step voltages differ by relatively small amount(s) (e.g., 0.15V).

Figure 2:
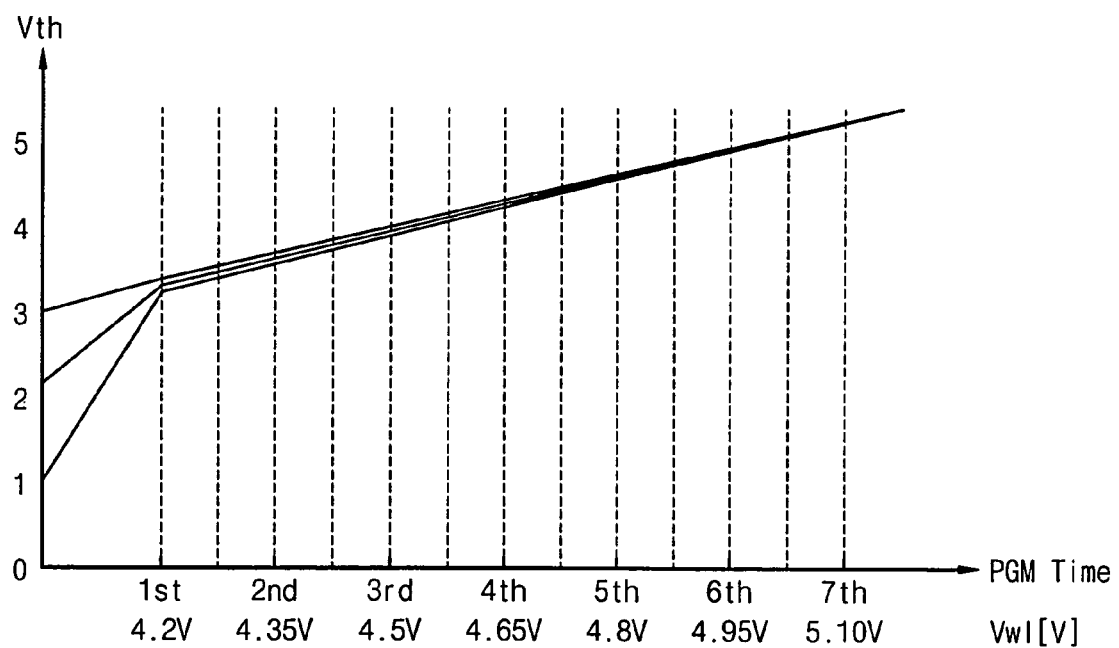
FIG. 2 is a graph illustrating, for three different initial states, the fluctuation of the threshold voltage of a memory cell when step voltages are applied to a word line in the NOR flash memory device illustrated in FIG. 1 in accordance with the ISPP scheme.

FIG. 2 is a graph illustrating, for three different initial states, the fluctuation of a cell threshold voltage in response to successive step voltages applied to a corresponding word line in NOR flash memory device 100 in accordance with an exemplary ISPP scheme.

NOR flash memory device 100 applies a first step voltage of 3V or 4.2V to the word line in order to program one or more cell(s) to either the 10 voltage or the 01 voltage. Thus, the first step voltage applied to the programmed cell(s) is not the 11 voltage. Instead, a higher step voltage is applied in order to increase programming speed by reducing the variance of the threshold voltage(s) for each programmed cell between maximum and minimum programming voltages (i.e., initially moving the threshold voltage for each programmed cell to a mid-range value).

Thus, the example illustrated in FIG. 2 shows, for three different initial voltage states, the fluctuation of a cell threshold voltage as step voltages are applied to program an initially erased cell to the 01 voltage. The threshold voltage state for the three illustrated examples of the erased cell vary in a range from 1V to 3V. If a first step voltage of 4.2V is applied to the cell during a first programming step, the resultant threshold voltage of the cell is about 3.2V. During successive programming steps, successive step voltages are applied such that the cell threshold voltage rises to at least 5.1V.

In order to enhance programming speed, NOR flash memory device 100 uses a bit scan method to program cells using an ISPP scheme. The bit scan method comprises steps of repeatedly detecting bit groups from the input data and, for each bit group, simultaneously programming all of the cells corresponding to a bit in the bit group. In one embodiment, a "bit group" comprises, at most, a number of bits equal to a scan bit number, wherein each bit in the bit group has a data value of "0." A cell corresponding to a bit having a data value of "1" stores a 2-bit data value, even though a programming operation is not performed on that cell, because memory cells in NOR flash memory device 100 are erased (i.e., store the 11 voltage) initially. As noted above, the bit scan method makes it possible to enhance programming speed and shorten programming time.

If the number of cells simultaneously programmed by the bit scan method increases, the programming time may be reduced. However, the maximum number of cells that can be programmed simultaneously is practically limited by the voltage capacity of a bit line pump circuit (not shown) associated with the NOR flash memory device.

Figure 3:
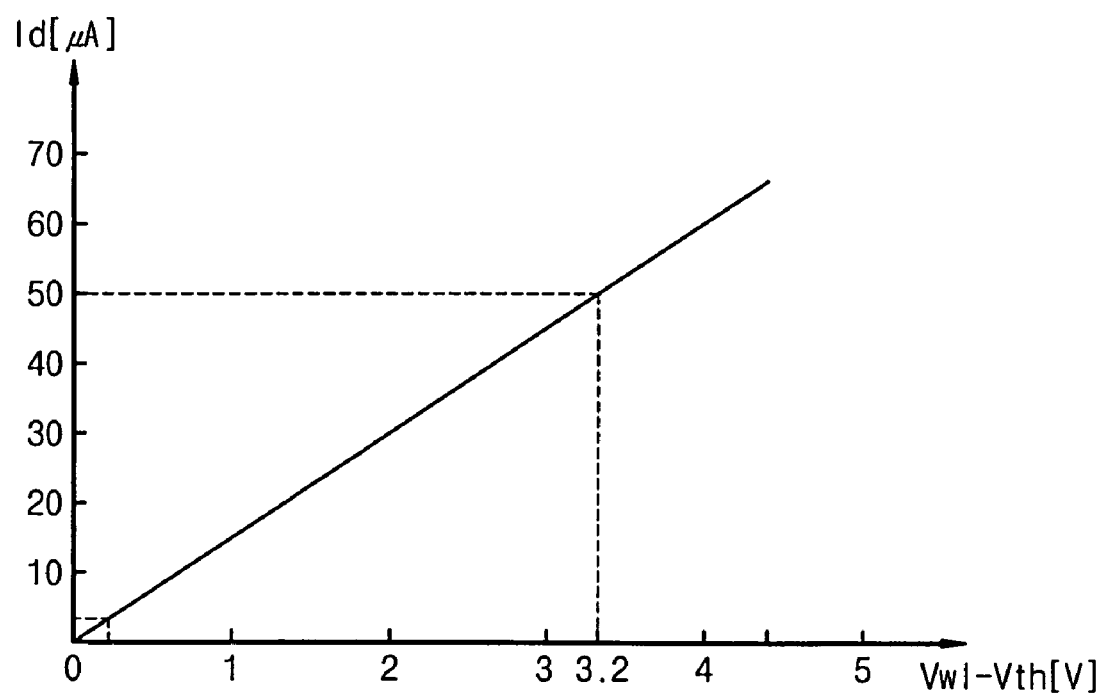
FIG. 3 is a graph illustrating the fluctuation of a bit line current in accordance with a difference between the word line voltage and a threshold voltage of a memory cell in the NOR flash memory device of FIG. 1.

FIG. 3 is a graph illustrating the fluctuation of bit line current in accordance with the difference between word line voltage and cell threshold voltage in NOR flash memory device 100. In this example, it is assumed that the maximum bit line current capable of being provided by associated bit line pump circuit is approximately 200 microamperes. Maximum consumption of the bit line current occurs when cell threshold voltage is 1 volt and a first step voltage of 4.2V is applied to the word line.

Referring to FIGS. 2 and 3, the maximum difference between the word line voltage and the threshold voltage is 3.2V, which is when the word line voltage is first step voltage 4.2V and the threshold voltage is 1V. Under these conditions (i.e., a maximum voltage difference of 3.2V), bit line current (Id) is equal to 50 microamperes. Given the working assumption of a maximum bit line current equal to 200 microamperes, it then follows that a maximum of four (4) bits may be simultaneously programmed using the bit scan method.

However, when the second through seventh step voltages are applied in FIG. 2, the difference between the word line voltage and the threshold voltage has already fallen well below 1V. When the difference between the word line voltage and the threshold voltage falls below 1V, the corresponding bit line current Id is falls below 10 microamperes. Thus, when the difference between the word line voltage and the threshold voltage has fallen below 1V, the current required from the bit line pump circuit will remain well below its maximum capacity even if the number of cells simultaneously programmed were increased to ten.

When NOR flash memory device 100 performs a programming operation using an ISPP scheme, the maximum number of cells that may be simultaneously programmed during any of the periods in which the second through seventh step voltages are applied is greater than the maximum number of cells that may be simultaneously programmed during the time period in which the first step voltage is applied. Thus, by simultaneously programming more cells during time periods in which any one of second through seventh step voltages are applied, as compared with the time period in which the first step voltage is applied, programming speed may be enhanced and overall programming time for the NOR flash memory device may be reduced relative to conventional programming methods.

Returning to FIG. 1, NOR flash memory device 100 comprises a word line voltage generator 105, a write driver circuit 120, a scan data latch circuit 130, a scan controller 140, and a data input buffer 150.

As NOR flash memory device 100 performs a programming operation, word line voltage generator 105 supplies successive step voltages to word line WL which is connected to each cell in the plurality of cells. In the illustrated example of a NOR flash memory device 100 programmed using the ISPP scheme, word line voltage generator 105 supplies step voltages that differ by a relatively small amount(s) (e.g., 0.15V) in order to minimize, under other practical considerations, the range of coherent threshold voltages for the memory cells.

Of note, if the first step voltage applied to one or more programmed cell(s) were the 11 voltage, then the number of programming steps (i.e., incremental applications of successive step voltages) required to program the cell(s) would increase beyond the seven programming steps illustrated in the working example. This increase in programming steps would necessarily lengthen the total programming time for the NOR flash memory device. Instead, the first step voltage is set, for example, to 3V to program the cell(s) to the 10 voltage, and/or to 4.2V to program the cell(s) to the 01 voltage.

The first programming step in the contemplated ISPP scheme, which applies the first step voltage, requires more time to execute than the second programming step, which applies a second step voltage. This result arises from the fact that the threshold voltage of the cell being programmed must rise from an initial voltage to a voltage near the first step voltage during the first programming step, whereas in the second programming step, the threshold voltage of the cell must only rise from near the first step voltage to near the second step voltage. Thus, because the difference between the first and second step voltages is less than the difference between the initial threshold voltage and the first step voltage, only four cells may be simultaneously programmed every microsecond in the first programming step, while up to eight cells may be simultaneously programmed every 0.5 microseconds in the second programming step. Thus, during the first programming step the scan bit number is four, while during the second programming step the scan bit number is eight. These conclusions are, of course, drawn to the illustrated example(s), but may be extrapolated across any reasonable number of programmed cells and scan bit numbers in variant embodiments.

Data input buffer 150 receives external data and supplies the received data to scan controller 140. Thereafter, scan controller 140 detects bit groups from the received data. Consistent with the illustrated example, each bit in the detected bit groups has the data value of "0," and each bit group comprises, at most, the number of bits indicated by the scan bit number (e.g., 4 or 8 bits). The "0" data values of the detected bits are supplied to data latch circuit 130. In one embodiment, scan data latch circuit 130 enables selected write drivers WD in write driver circuit 120 in accordance with the latched "0" data values.

Write driver circuit 120 comprises a plurality of write drivers WD, each of which is connected to a bit line BL of a memory cell. In accordance with corresponding "0" data values stored in scan data latch circuit 130, each of the write drivers WD that corresponds to a "0" data value latched in scan data latch circuit 130 supplies a write voltage to its corresponding bit line BL. A programming operation is performed on each cell whose bit line BL receives a write voltage, but is not performed on any cell whose respective bit line BL does not receive a write voltage.

Figure 4:
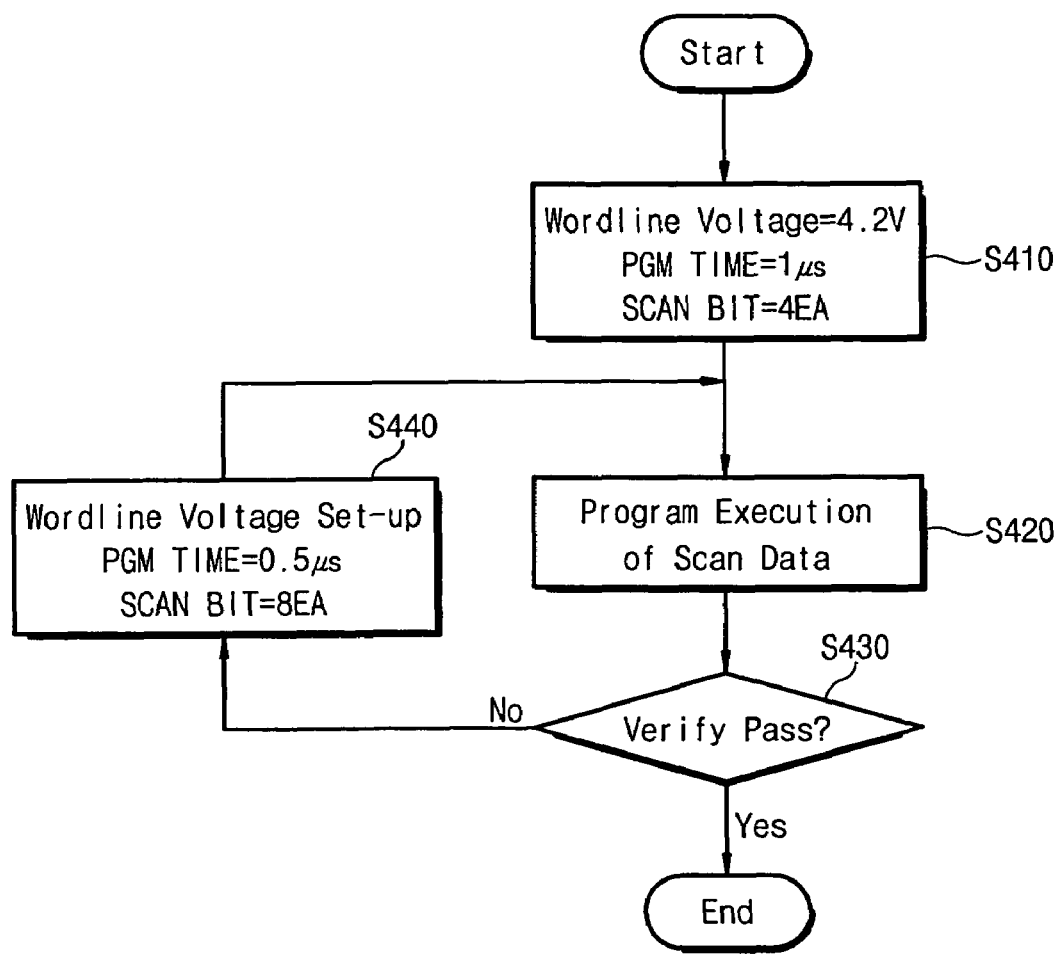
FIG. 4 is a flowchart illustrating a program operation for the NOR flash memory device of FIG. 1.

FIG. 4 is a flowchart illustrating one exemplary programming operation for NOR flash memory device 100. In the illustrated programming operation, it is again assumed that an erased cell is being programmed to the 01 voltage.

It is further assumed in the working example that each first programming duration (e.g., "PGM TIME") is equal to 1 microsecond, a first step voltage of 4.2V is supplied to the word line, and a bit group, comprising, at most, the number of bits indicated by a first scan bit number (e.g., 4), is detected, and each bit in the bit group has a data value of "0" (S410). With this setup, up to four (4) bits having a data value of "0" are detected within the 1 microsecond PGM TIME period and programmed by application of the first step voltage to the word line WL (S420). Thereafter, a verification step (S430) is performed to determine whether each programmed cell has a desired threshold voltage (e.g., the 01 voltage).

If one or more of the programmed cells has not reached the 01 voltage, a second programming step setup and executed. The second programming step may be executed during a time period different from and preferably shorter than the time period associated with the first programming step (e.g., 0.5 microseconds). In the illustrated example, a second step voltage of 4.35V is supplied to the word line during the second programming step. In the second programming step, however, the bit group may comprise, at most, a number of bits indicated by a second scan bit number (e.g., 8). Here again, it is assumed that each bit in the bit group has a data value of "0" (S440). With this set up, up to eight (8) bits having a data value of "0" may be detected during the second programming step and programmed by application of the second step voltage to the word line (S420).

Whether following application of the first step voltage or application of the first and second step voltage, if the programmed cell reaches the 01 voltage, the programming operation is completed. Third, fourth, fifth, sixth, and/or seventh programming steps may be similarly implemented by appropriately modifying the setup conditions in the iterative step S440. In this manner, the selected cells may programmed to a desired threshold voltage.

In the illustrated example, up to four (4) cells may be programmed simultaneously during the first programming step, but up to eight (8) cells may be programmed simultaneously during in each of the second through seventh programming steps. Simultaneously programming a greater number of cells in each one of the iterative (e.g., non-first programming steps) is possible because, as described previously, the bit line current required to program each cell is less during the iterative programming steps than is required during the first programming step.

FIG. 5 is a concept diagram illustrating the time required to perform a programming operation in NOR flash memory device 100 using an ISPP scheme according to one embodiment of the invention. FIG. 5 shows that a selected number of 32 cells of NOR flash memory device 100 are programmed to the 01 voltage in a total of 15 microseconds using successive step voltages. The selected cells of NOR flash memory device 100 are indicated in FIG. 5 by the 32 bits of data shown in FIG. 5.

Referring to FIG. 5, a first step voltage of 4.2V is applied to the word line during a first programming step. That is, every microsecond during which the first step voltage is applied to the word line, four bits, each having a data value of "0," are detected, and the threshold voltage of each cell that corresponds to the (up to) four detected bits is increased in accordance with the applied first step voltage. In the illustrated example, a total time of six (6) microseconds is thus required to perform the first programming step for all 32 bits of received data.

A second step voltage of 4.35V is then supplied to the word line during respective second programming steps. That is, every 0.5 microseconds during which the second step voltage is applied to the word line, eight bits, each having a data value of "0," are detected, and the threshold voltage of each cell that corresponds to the (up to) eight detected bits is increased in accordance with the second step voltage. Thus, a total time of 1.5 microseconds is required to perform the second programming step for the 32 bits of received data.

Each of the third through the seventh programming steps is performed in similar fashion, except that each of the third through the seventh programming steps uses the third through the seventh step voltages, respectively. Therefore, given the foregoing exemplary assumptions, a total of 15 microseconds are required to program the memory cells storing 32 bits of received data in the flash memory device illustrated in FIG. 5.

Figure 6:
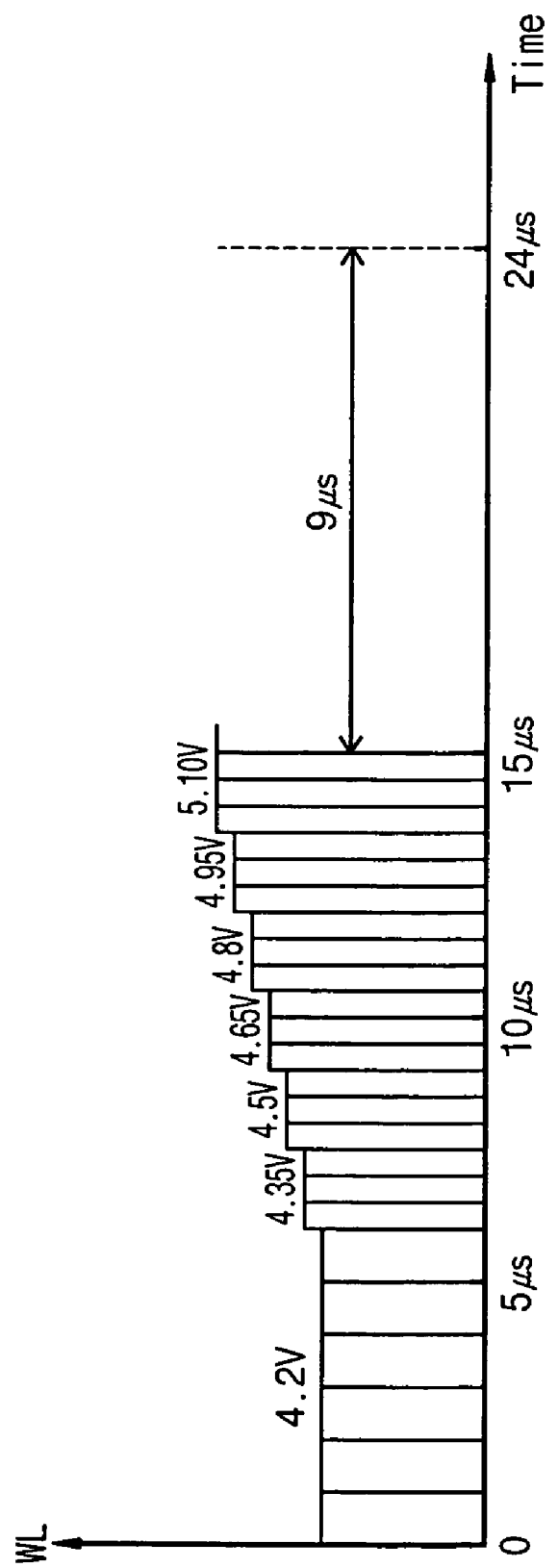
FIG. 6 is a graph showing step voltages applied, using the ISPP scheme, to the word line of the NOR flash memory device illustrated in FIG. 1.

FIG. 6 is a graph showing the exemplary step voltages applied to the word line of NOR flash memory device 100 using an ISPP scheme. As illustrated in the graph of FIG. 6, a total of 15 microseconds are required to program an erased cell to the 01 voltage.

Since a conventional NOR flash memory device using a bit scan method uses the same scan bit number irrespective of the step voltage levels, the conventional NOR flash memory device uses more time than is necessary for the programming operation. For example, a conventional NOR flash memory device will program four cells every 0.5 microseconds during second through seventh program operation parts. Thus, in accordance with the exemplary 32 bits of data of FIG. 5, the conventional NOR flash memory device will require a total of 24 microseconds to program the erased cells indicated by the 32 bits of data of FIG. 5. Regarding the exemplary data of FIG. 5, NOR flash memory device 100 achieves a shorter total program operation time than the conventional memory device by 9 microseconds.

In accordance with NOR flash memory device 100 using a program method thereof comprising a bit scan method with a variable scan bit number, the maximum number of cells to be programmed simultaneously is governed in accordance with the successive step voltages to increase program operating speed and shorten the total program operation time.

Although exemplary embodiment(s) of the present invention have been described in detail, it will be understood by those of ordinary skill in the art that the present invention is not limited to the exemplary embodiments, but rather that various substitutions and modifications may be made while remaining within the scope of the invention as defined in the appended claims.

What is claimed is:

1. A NOR flash memory device, comprising:
    a plurality of memory cells;
    a word line voltage generator configured to apply successive step voltages to a word line connected to the plurality of memory cells; and,
    a scan controller configured to detect a bit group in relation to a scan bit number, and further configured to change the scan bit number in relation to one or more of the step voltages,
    wherein bits in the bit group correspond to memory cells to be simultaneously programmed, and wherein the bit group comprises, at most, the number of bits indicated by the scan bit number.

2. The device of claim 1, wherein a first scan bit number associated with a first step voltage is not equal to a second scan bit number associated with a second step voltage.

3. The device of claim 2, wherein the first scan bit number is smaller than the second scan bit number.

4. The device of claim 3, wherein the total current flowing to the memory cells simultaneously programmed in a first bit group defined in relation to the first scan bit number is greater than the total current flowing to the memory cells simultaneously programmed in a second bit group defined in relation to the second scan bit number.

5. The NOR flash memory device of claim 1, wherein the plurality of memory cells are multi-level cells adapted to store any one of a plurality of data values in accordance with a threshold voltage distribution.

6. The NOR flash memory device of claim 5, wherein the multi-level cells are adapted to store 2-bit data in accordance with the threshold voltage distribution.

7. The NOR flash memory device of claim 6, wherein the threshold voltage distribution comprises four (4) threshold voltages.

8. A NOR flash memory device of claim 1, further comprising:
    a scan data latch circuit configured to latch at least the bit group detected by the scan controller; and,
    a write driver circuit configured to apply write voltages to bit lines of memory cells selected from the plurality of memory cells in accordance with the data latched by the scan data latch circuit.

9. The device of claim 8, wherein a first scan bit number associated with a first step voltage is not equal to a second scan bit number associated with a second step voltage.

10. The device of claim 9, wherein the first scan bit number is smaller than the second scan bit number.

11. A method of programming a NOR flash memory device comprising a plurality of memory cells and configured to supply successive step voltages to a word line connected to the plurality of memory cells, the method comprising:

defining a first programming step in relation to a first step voltage, a first programming step time period, and a first scan bit number;

defining a second programming step in relation to a second programming step voltage, a second programming step time period, and a second scan bit number greater than the first scan bit number;

during the first programming step time period, applying the first step voltage to the word line, detecting a bit group in relation to the first scan bit number and programming memory cells associated with the detected bit group in accordance with the applied first step voltage;

performing a verification operation to determine whether the programmed memory cells have a desired threshold voltage; and if not, during the second programming step time period, applying the second step voltage to the word line, detecting a bit group in relation to the second scan bit number and programming memory cells associated with the detected bit group in accordance with the applied second step voltage.

12. The method of claim 11 wherein the first programming step time period comprises a plurality of first program time intervals, and wherein the second programming step time period comprises a plurality of second program time intervals.

13. The method of claim 12 wherein each first program time interval of the plurality of first program time intervals is greater than each second program time interval of the plurality of second program time intervals.

14. The method of claim 13 wherein each first program time interval of the plurality of first program time intervals is equal to 1 microsecond, and wherein each second program time interval of the plurality of second program time intervals is equal to 0.5 microseconds.

15. The method of claim 11, wherein the second programming step comprises an iterative programming step performed following the first programming step, and wherein the method further comprises:

defining the iterative programming step in relation to an iterative step voltage, an iterative programming step time period, and an iterative scan bit number;

repeatedly performing the iterative programming step until the verification operation determines that the programmed memory cells have the desired voltage threshold.

16. The method of claim 15, wherein the iterative step voltage increases with each repeated performance of the iterative programming step.

17. The method of claim 15, wherein the iterative programming period remains fixed for each repeated performance of the iterative programming step, and wherein the iterative programming period is less than the first programming step time period.

18. The method of claim 15, wherein the iterative scan bit number remains fixed for each repeated performance of the iterative programming step.

19. The method of claim 18, wherein the iterative scan bit number is greater than the first scan bit number.

* * * * *